US009188752B2

United States Patent
Nong Chou et al.

(10) Patent No.: US 9,188,752 B2
(45) Date of Patent: Nov. 17, 2015

(54) OPTICAL-ELECTRICAL CONNECTOR HAVING INPROVED HEAT SINK

(71) Applicant: HON HAI PRECISION INDUSTRY CO., LTD., New Taipei (TW)

(72) Inventors: Wei Nong Chou, La Puente, CA (US); Jun-Bin Huang, Eastvale, CA (US); Gang Paul Chen, Walnut, CA (US); Jie Zheng, Rowland-Heights, CA (US); Yuan-Chieh Lin, Lake Forest, CA (US); An-Jen Yang, Irvine, CA (US); Jim Zhao, Irvine, CA (US); Qing-Man Zhu, Kunshan (CN); Shuai-Hui Huang, Kunshan (CN); Li-Shing Hou, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 98 days.

(21) Appl. No.: 14/075,062

(22) Filed: Nov. 8, 2013

(65) Prior Publication Data

US 2015/0132990 A1    May 14, 2015

(51) Int. Cl.
  G02B 6/42    (2006.01)
  H05K 1/02    (2006.01)
  G02B 6/38    (2006.01)
(52) U.S. Cl.
  CPC .............. *G02B 6/4266* (2013.01); *G02B 6/426* (2013.01); *G02B 6/4257* (2013.01); *H05K 1/0201* (2013.01); *G02B 6/3807* (2013.01)
(58) Field of Classification Search
  CPC ..... G02B 6/4257; G02B 6/426; G02B 6/4266
  See application file for complete search history.

(56) References Cited

U.S. PATENT DOCUMENTS

| 6,787,812 | B2 | 9/2004 | Isaksson |
| 7,281,864 | B2 | 10/2007 | Mizue et al. |
| 7,367,718 | B2 | 5/2008 | Oki et al. |
| 7,457,126 | B2 | 11/2008 | Ahrens |
| 7,794,156 | B2 | 9/2010 | Wang et al. |
| 7,898,808 | B2 | 3/2011 | Joiner et al. |
| 8,223,498 | B2 | 7/2012 | Lima |
| 2011/0031379 | A1* | 2/2011 | Ishigami et al. .............. 250/216 |

* cited by examiner

*Primary Examiner* — Jerry Rahll
(74) *Attorney, Agent, or Firm* — Ming Chieh Chang; Wei Te Chung

(57) ABSTRACT

An optical-electrical connector (100) having an end for mating with an electrical connector and an opposite end coupling with an optical medium, includes a thermal conductive shell (10), a printed circuit board assembly (20) received in the thermal conductive shell, and an optical-electrical module (50). The printed circuit board assembly includes a printed circuit board (21) including a thermal conductive layer (214) thermal conductively connected with the metal shell. The optical-electrical module is mounted on the printed circuit board and is in contact with the thermal conductive layer, heat produced by the optical-electrical module being transmitted to the thermal conductive shell by the thermal conductive layer.

7 Claims, 8 Drawing Sheets

OPTICAL-ELECTRICAL CONNECTOR HAVING INPROVED HEAT SINK

BACKGROUND OF THE INVENTION

1. Field of the Invention

The present invention relates to an optical-electrical connector, and more particularly to an optical-electrical connector for communication application.

2. Description of Related Arts

U.S. Pat. No. 8,223,498, issued on Jul. 17, 2012, to Lima. discloses an optical-electrical connector inserted into an outer shell of a mating connector. The optical-electrical connector comprises a shell and a printed circuit board assembly received in the shell. The outer shell comprises a plurality of side walls, and a receiving room having an opening formed by the side walls. The optical-electrical connector is inserted into the receiving room from the opening. A top of the side walls defining an upper opening. A heat sink mounted to the upper opening to directly contact with the top surface of the shell to facilitate heat transfer from the top portion of the optical-electrical connector. However, the heat is produced in the inner portion of the optical-electrical connector hard to transmit to the outer of the shell.

An improved optical-electrical connector is desired to offer advantages over the related art.

SUMMARY OF THE INVENTION

An object of the present invention is to provide an optical-electrical connector having an improved heat sink.

To achieve the above-mentioned object, an optical-electrical connector having an end for mating with an electrical connector and an opposite end coupling with an optical medium, comprises:
a thermal conductive shell;
a printed circuit board assembly received in the thermal conductive shell, the printed circuit board assembly comprising a printed circuit board comprising a thermal conductive layer thermal conductively connected with the metal shell; and
an optical-electrical module mounted on the printed circuit board and being in contact with the thermal conductive layer, heat produced by the optical-electrical module being transmitted to the thermal conductive shell by the thermal conductive layer.

According to the present invention, printed circuit board comprises a thermal conductive layer thermal conductively connected with the metal shell, the optical-electrical module mounted on the thermal conductive layer. Therefore, heat produced by the optical-electrical module could be transmitted to the thermal conductive shell by the thermal conductive layer.

DETAILED DESCRIPTION OF THE PREFERRED EMBODIMENT

Reference will now be made in detail to a preferred embodiment of the present invention.

Figure 1:
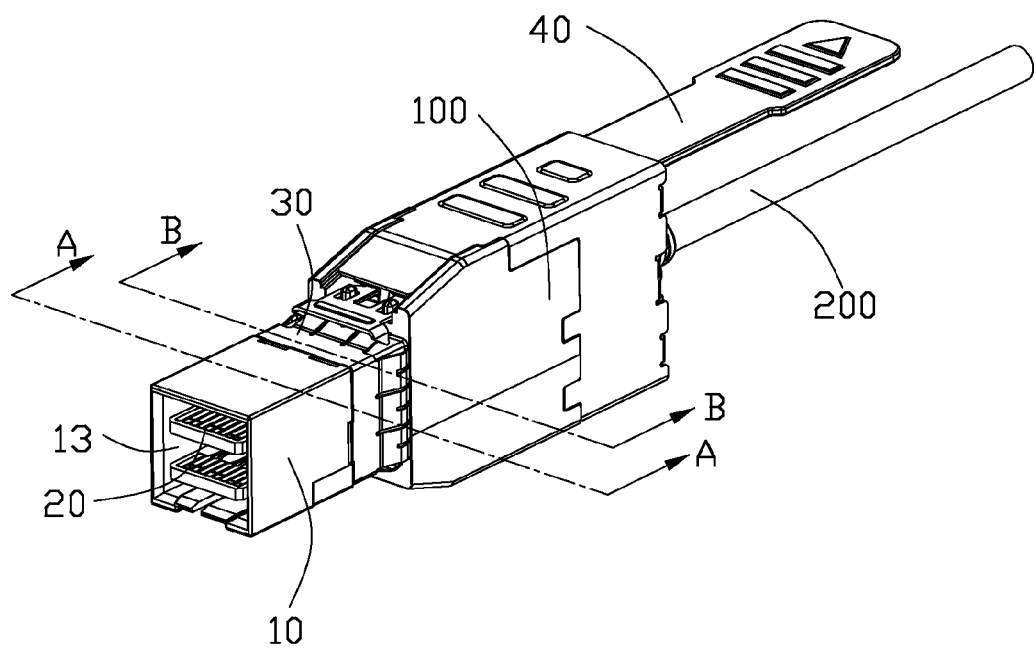
FIG. 1 is a perspective view of an optical-electrical connector connected with an optical cable in accordance with the present invention.
Figure 2:
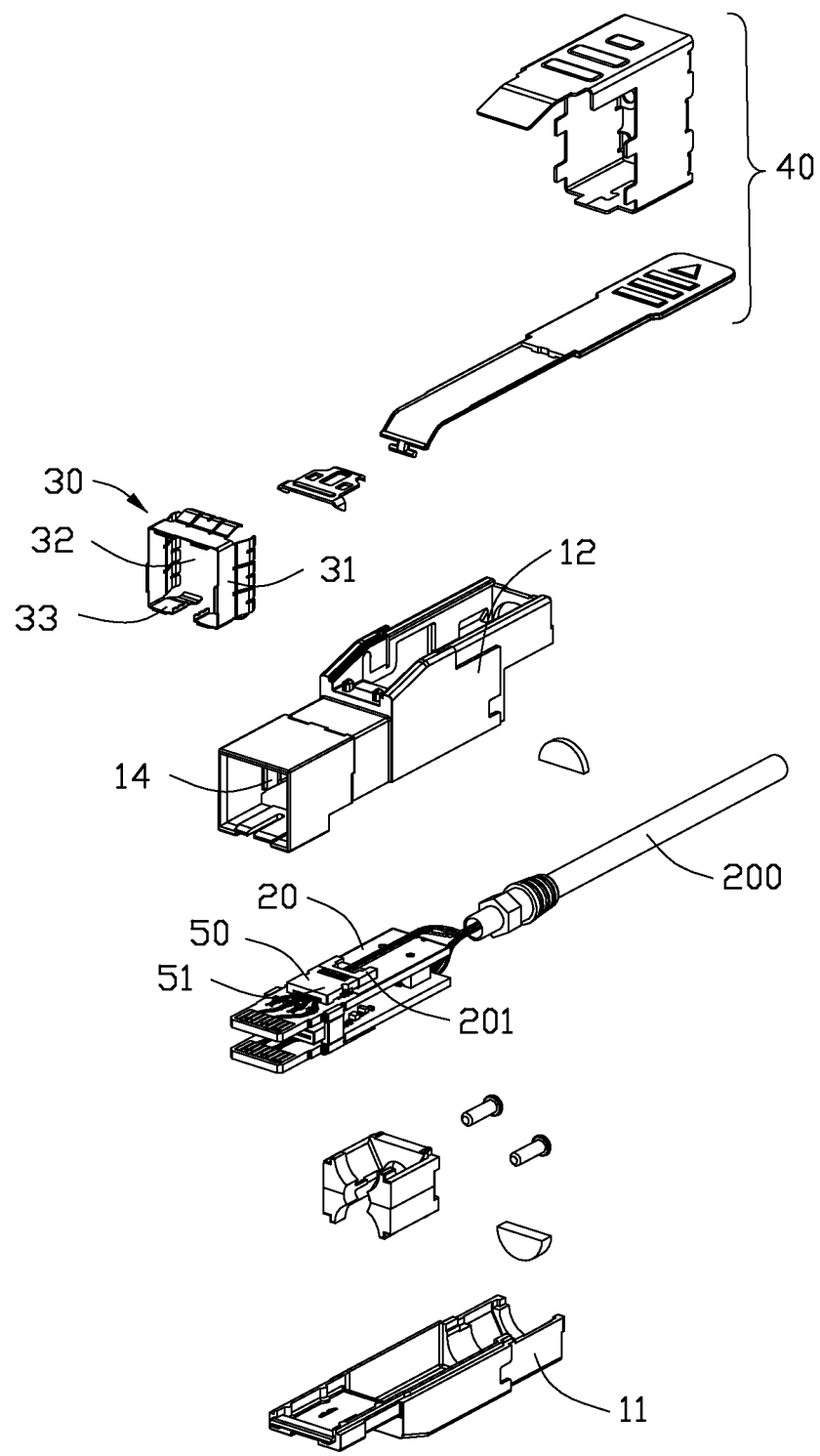
FIG. 2 is an exploded view of the optical-electrical connector and the optical cable as shown in FIG. 1.
Figure 3:
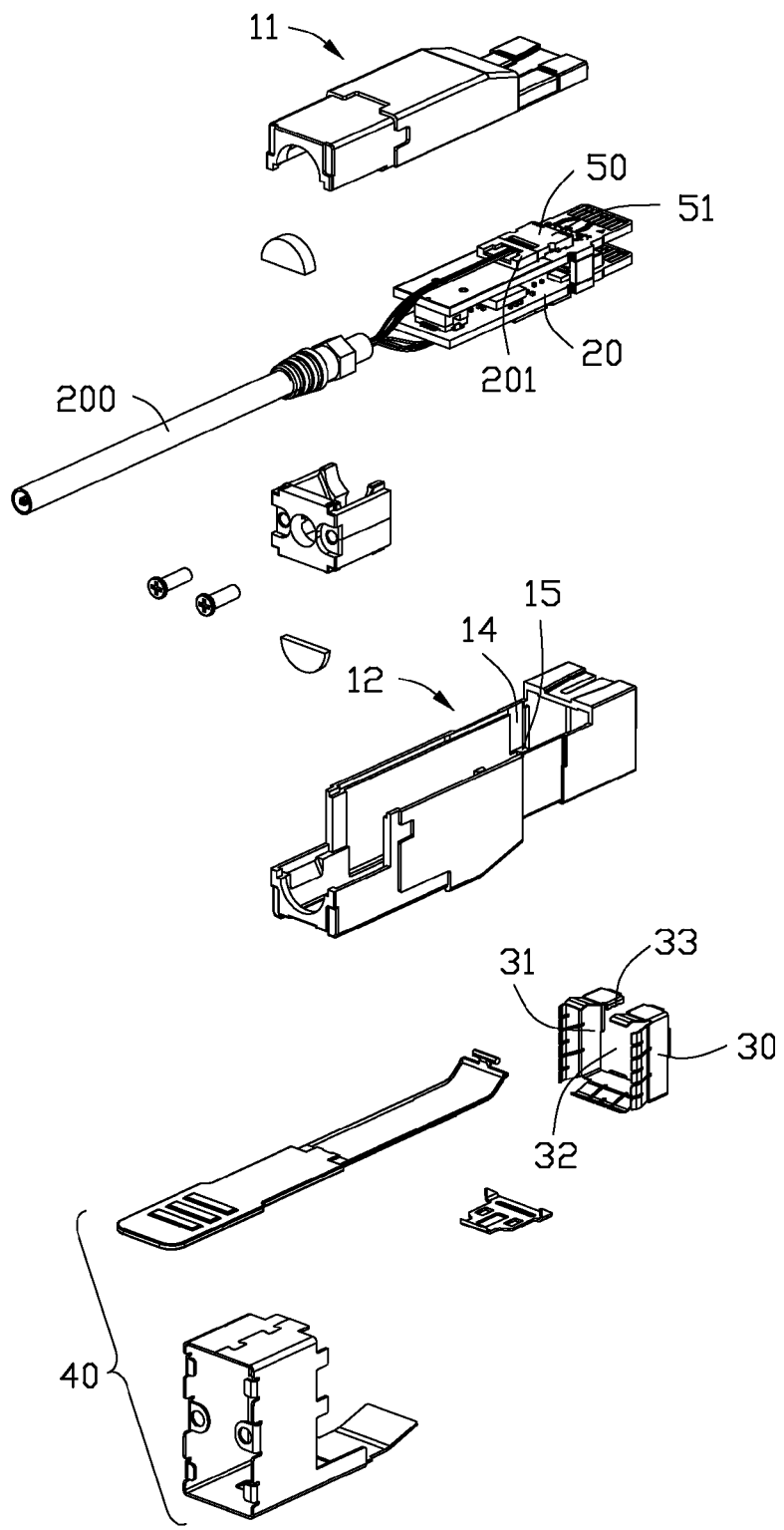
FIG. 3 is another exploded view of the optical-electrical connector and the optical cable as shown in FIG. 2.
Figure 4:
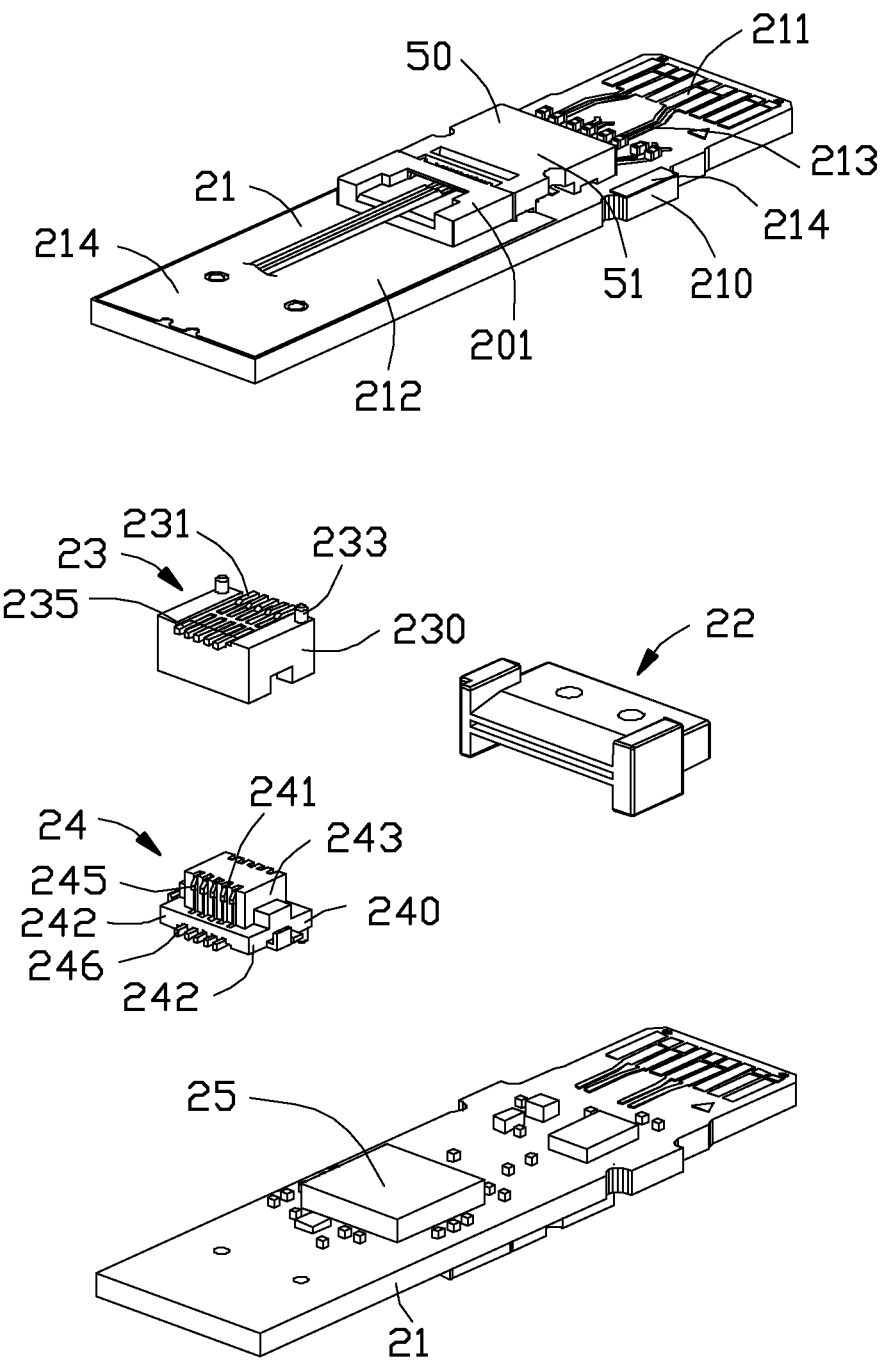
FIG. 4 is an exploded view of the printed circuit board assembly of the optical-electrical connector as shown in FIG. 1.
Figure 5:
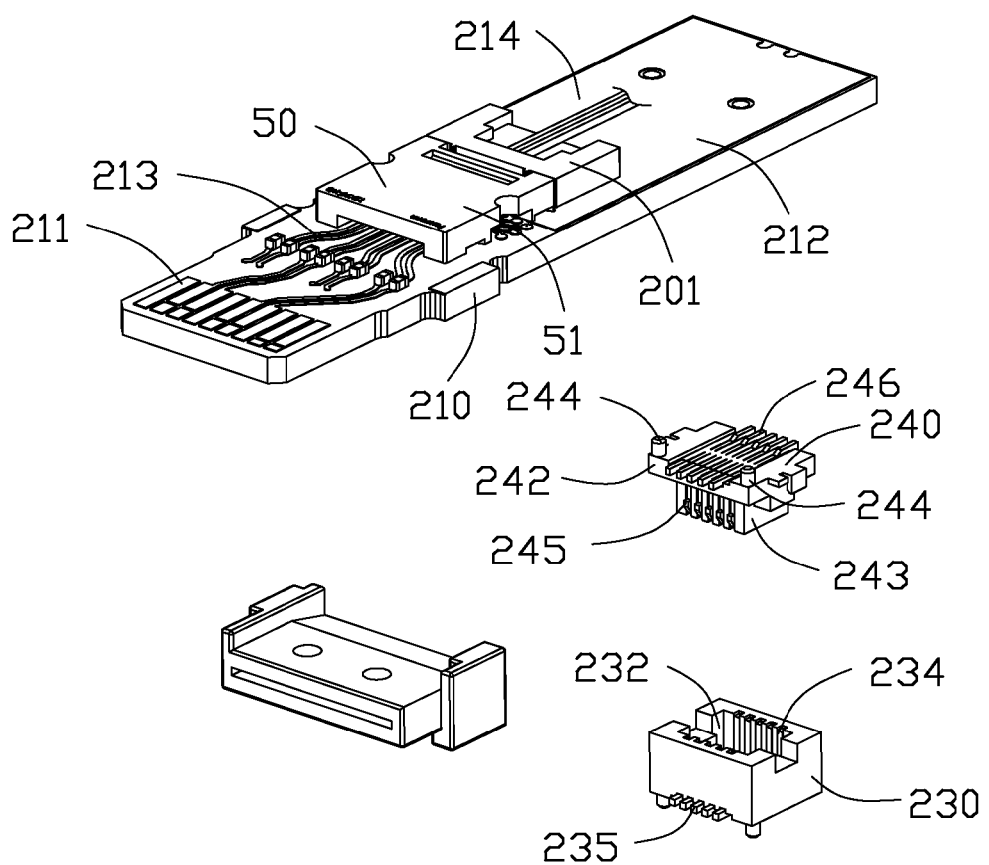
FIG. 5 is another exploded view of the printed circuit board assembly as shown in FIG. 4.
Figure 5:
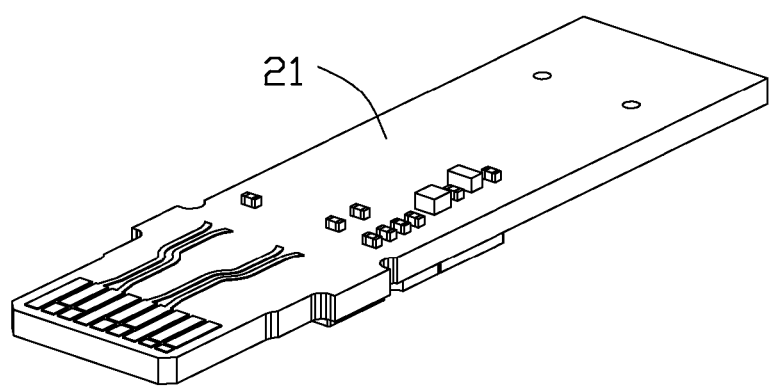
Figure 6:
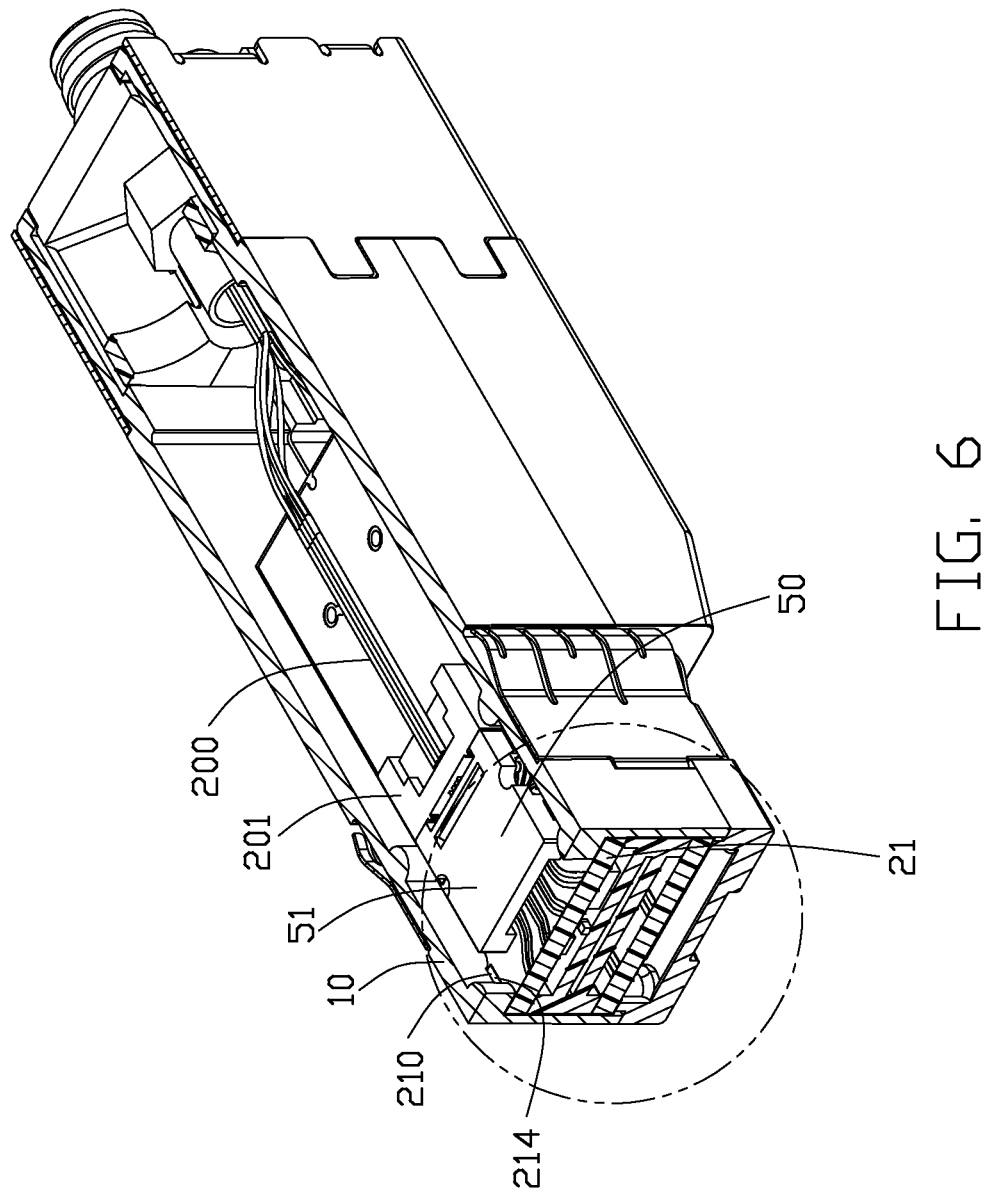
FIG. 6 is a cross-sectional view of the optical-electrical connector taken along line 6-6 of FIG. 1 (a top wall of the thermal conductive shell is removed).
Figure 7:
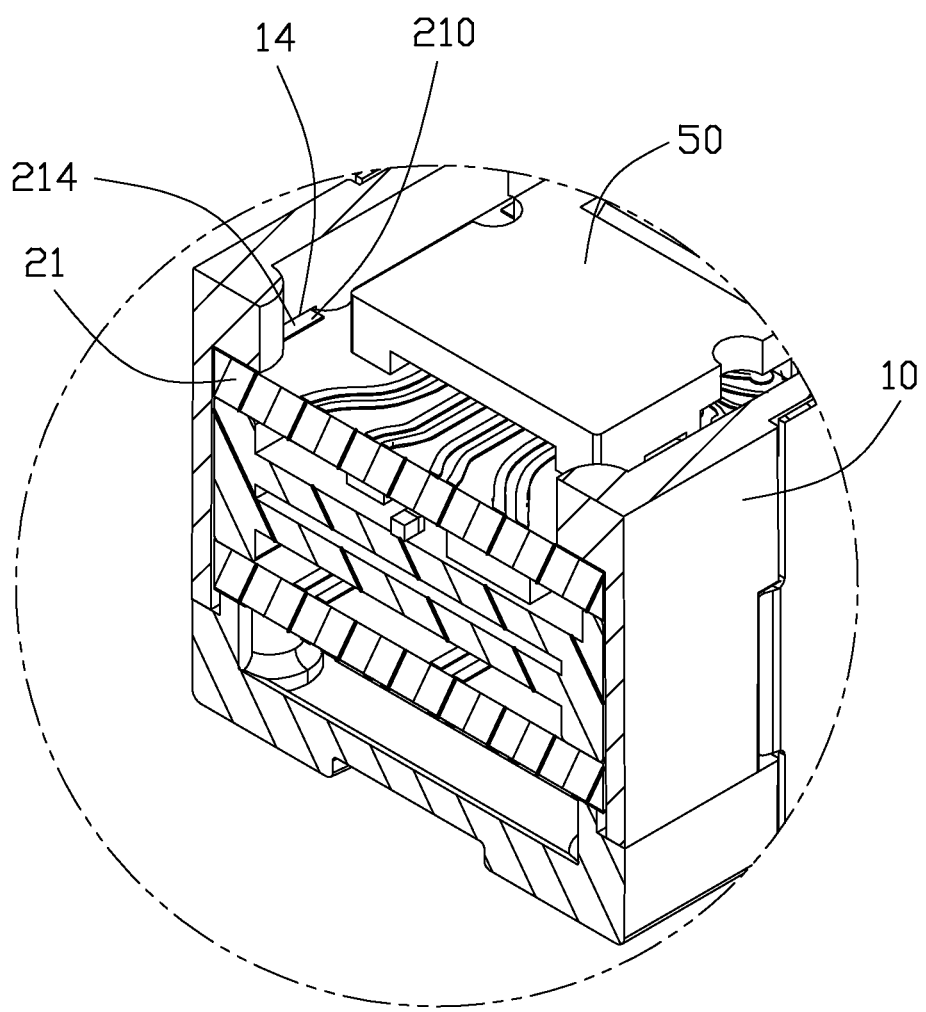
FIG. 7 is an enlarge view of the circle portion of the optical-electrical connector as shown in FIG. 6.
Figure 8:
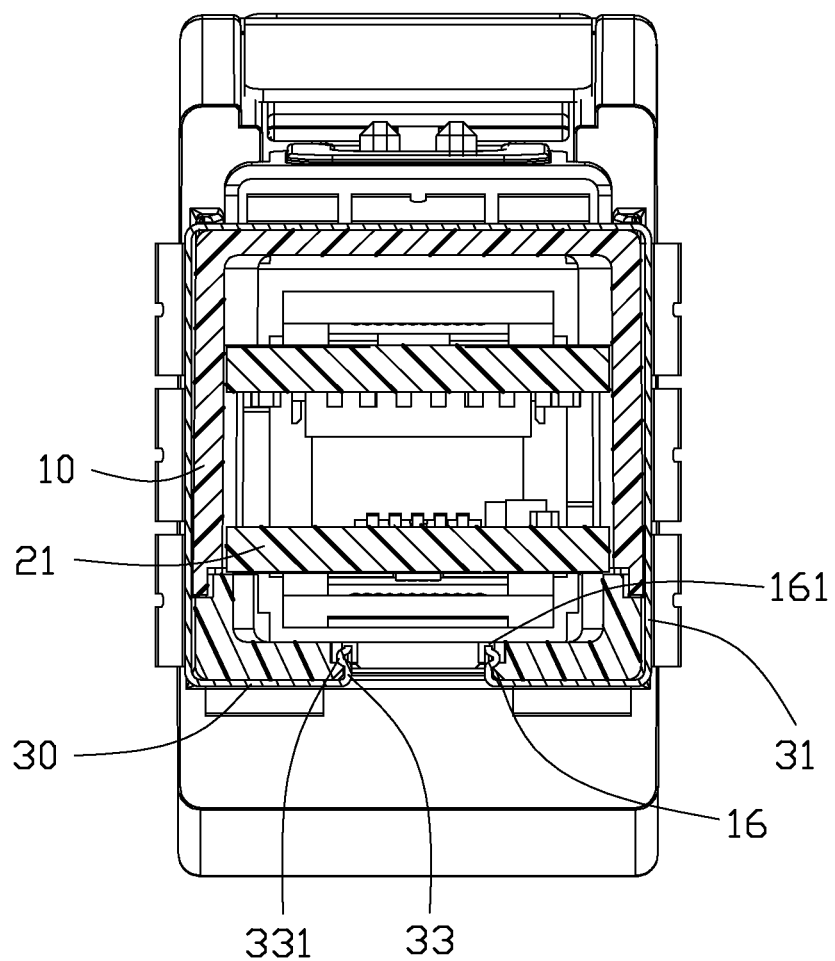
FIG. 8 is a cross-sectional view of the optical-electrical connector taken along line 8-8 of FIG. 1.

Referring to FIGS. 1 to 8, an optical-electrical connector 100 having an end for mating with an electrical connector (not shown) and an opposite end coupling with an optical medium 200, comprises a thermal conductive shell 10, a printed circuit board assembly 20 received in the thermal conductive shell 10, an electromagnetic interference gasket 30 surround with the thermal conductive shell 10, a latching assembly 40 assembled to the thermal conductive shell 10, and a optical-electrical module 50 mounted on the printed circuit board 20 for converting an optical signal to an electrical signal or converting an electrical signal to an optical signal.

Referring to FIGS. 1 to 3 and 6 to 8, The thermal conductive shell 10 could be manufactured by good thermal conductivity material such as metal, sapphire etc. The thermal conductive shell 10 comprises a bottom shell 11 and an upper shell 12 assembled to the bottom shell 11. The bottom shell 11 and the upper shell 12 cooperate to form a receiving space 13 to receiving the printed circuit board assembly 20. The thermal conductive shell 10 comprises a pair of opposite inner faces. Both of the inner faces define a cavity 14 and a stepped surface 15 formed between the cavity 14 and the inner face of the thermal conductive shell 10. The thermal conductive shell 10 defines a pair of mounting slots 16 extending from an outer face to inner portion of the thermal conductive shell 10, and a latch tab 161 projected into the corresponding one mounting slot 16.

Referring to FIGS. 2 to 7, the printed circuit board assembly 20 comprises a pair of printed circuit boards 21 spaced apart from each other along a vertical direction, a supporting member 22 disposed between the pair of printed circuit boards 21, a first connector 23 electrically mounted on one of the printed circuit boards 21, a second connector 24 electrically mounted on the other printed circuit board 21 for electrically mating with the first connector 23, and a common used electronic element 25, such as Micro-Controller etc, mounted on the one printed circuit board 21. The pair of the printed circuit boards share the electronic element 25 by the first connector 23 mating with the second connector 24 to lower cost. The first connector 23 comprises a first insulative housing 230 mounted on the one printed circuit board 21 and a plurality of first contacts 231 received in the first insulative housing 230. The first insulative housing 230 comprises a receiving room 232 and a pair of first posts 233 for being mounted to the one printed circuit board 21. The first contacts 231 are arranged in two rows and received in opposite sides of the receiving room 232. Each of the first contacts comprises a first mating portion 234 received into the receiving room 231 for mating with the second connector 24, and a first soldering portion 235 extending beyond the first insulative housing 230 for being soldered on the one printed circuit board 21. The second connector 24 comprises a second insulative housing 240 mounted on the other printed circuit board 21 and a plurality of second contacts 241 assembled to the second insulative housing 240. The second insulative housing 240 comprises a base portion 242, a mating portion 243 projected from a side of the base 242 for being inserted into the receiving room 232 of the first insulative housing 230 to make the first contacts 231 electrically connected with the second contacts 241, and a pair of second posts 244 projected from an opposite of the base 242 or being mounted to the other printed circuit board 21. The second contacts 241 are arranged in two rows and disposed at opposite outer faces of the mating portion 243. Each of the second contacts 241 comprises a second mating portion 245 disposed at the mating portion 243 of the second insulative housing 240 for mating with the first mating portion 234 of the first contact 231, and a second soldering portion 246 extending beyond the second insulative housing 240 for being soldered on the other printed circuit board 21. The electrically connecting between the pair of the printed circuit boards 21 could be established by other manners such as conductive wires, a signal connector, etc.

Each of the printed circuit boards 21 comprises a pair of tabs 210 projected from opposite sides of the printed circuit board 21 respectively. Each of the tabs 210 received into the cavity 14 of the thermal conductive shell 10 and directly connected or contacted with the stepped surface 15. Each of the printed circuit boards 21 comprises a plurality of mating pads 211 for electrically connecting with the electrical connector, a mounting area 212 for the optical-electrical module 50 being mounted, and a plurality of electrical traces 213 electrically connecting with the mating pads 211 respectively. The optical-electrical module 50 electrically connecting with the electrical traces 213. The mounting area 212 comprises a thermal conductive layer 214 extending arrived at the tabs 210. The optical-electrical module 50 is directly contacted with the thermal conductive layer 214. Therefore, heat produced by the optical-electrical module 50 is firstly transmitted to the thermal conductive layer 214, and then transmitted to the tabs 210, finally the heat transmitted to the thermal conductive shell 10. The thermal conductive layer 214, the mating pads 211 and the electrical traces 213 are disposed at a same plane. The thermal conductive layer 214 is insulated with the mating pads 211 and the electrical traces 213. In other embodiment, the thermal connecting between the printed circuit board 21 and the thermal conductive shell 10 could be established by a projection portion (not shown) extending from the thermal conductive shell 10 to directly contact or connect with the printed circuit board 21 to transmit heat. In this embodiment, one of the printed circuit board 21 is used for receiving signal, and the other printed circuit board is used for transmitting signal, but the number of the printed circuit could be one, two or others as it is need. One printed circuit board could be designed to receiving and transmitting signals at the same time.

Referring to FIGS. 1 to 3 and 8, the electromagnetic interference gasket 30 comprises a five side walls 31 connected in sequence formed a shape having a mounting space 32 for receiving the thermal conductive shell 10 and a circumferential opening. A pair of mounting walls 33 extend into the mounting space 32 from opposite sides of the circumferential opening respectively. Each of the mounting walls 33 comprises a pair of half ball shaped protrudings 331. When the mounting walls inserted into the mounting slots 16 respectively, the half ball shaped protrudings latch with the latch tabs 161 to fix the electromagnetic interference gasket 30 on the thermal conductive shell 10. The half ball shaped protruding having a dimension equal to 0.9 millimeter along a direction which the mounting space 32 extending is smaller than a spring tab punched the mounting walls 33 having a dimension equal to 1.2 millimeter. Therefore, the thickness of a wall of the thermal conductive shell 10 is reduced result from the dimension increased of the printed circuit board assembly 20, the mounting wall 33 could not to interfere with or shorting with the printed circuit board assembly 20.

Referring to FIGS. 2 to 5, there are a pair of optical-electrical modules 50 mounted to opposite sides of the pair of printed circuit board 21, respectively. Each of the optical-electrical modules 50 comprises a lens 51 and optical-electrical elements optical coupling with the lens 51. The optical-electrical element could be used to convent optical signal to electrical signal such as positive-intrinsic-negative photo diode etc or to convent electrical signal to optical signal such as vertical cavity surface emitting laser. The optical medium 200 is divided into two portions, each portion connected with a ferrule 201 to optical couple with the lens 51 to establish an optical path between the optical-electrical module 50 and the optical medium 200. The optical medium could be manufactured by optical fiber, polymer waveguide etc.

It is to be understood, however, that even though numerous characteristics and advanarmes of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An optical-electrical connector having an end for mating with an electrical connector and an opposite end coupling with an optical medium, comprising:
   a thermal conductive shell;
   a printed circuit board assembly received in the thermal conductive shell, the printed circuit board assembly comprising a printed circuit board comprising a thermal conductive layer thermal conductively connected with the thermal conductive shell; and
   an optical-electrical module mounted on the printed circuit board and being in contact with the thermal conductive layer, heat produced by the optical-electrical module being transmitted to the thermal conductive shell by the thermal conductive layer; wherein
   the printed circuit board comprises at least one tab at a side thereof, and the thermal conductive layer extends to the at least one tab to contact the thermal conductive shell.

2. The optical-electrical connector as recited in claim 1, wherein the at least one tab projects from the side of the printed circuit board to directly contact the thermal shell.

3. The optical-electrical connector as recited in claim 2, wherein the thermal conductive shell defines a cavity and a stepped surface formed between the cavity and an inner face of the thermal conductive shell, the at least one tab received into the cavity and the thermal conductive layer directly contacted with the stepped surface.

4. The optical-electrical connector as recited in claim 3, wherein the printed circuit board comprises a plurality of mating pads for electrically connecting with the electrical connector, and a plurality of electrical traces electrically connecting with the mating pads respectively, the optical-electrical module electrically connecting with the electrical traces, the thermal conductive layer, the mating pads and the electrical traces disposed at a same plane, the thermal conductive layer insulated with the mating pads and the electrical traces.

5. The optical-electrical connector as recited in claim 2, wherein there are a pair of tabs projected from two opposite sides of the printed circuit board, respectively.

6. An optical-electrical connector comprising:
   a thermal conductive shell;

a printed circuit board assembly received in the thermal conductive shell, the printed circuit board assembly comprising a pair of printed circuit boards each having a thermal conductive layer thermal conductively connected with the thermal conductive shell, an electronic element, a first connector, and a second connector;

a respective optical-electrical module mounted on each of the two printed circuit boards and being in contact with the thermal conductive layer, heat produced by the optical-electrical module being transferred to the thermal conductive shell by the thermal conductive layer;

wherein the pair of printed circuit boards are spaced apart from each other along a vertical direction, the electronic element is mounted on one of the printed circuit boards, and the other printed circuit board electrically connects with the one printed circuit board to share the electronic element;

wherein the first connector is electrically mounted on the one printed circuit board, and the second connector is electrically mounted on the other printed circuit board to electrically connect with the first connector;

wherein the first connector comprises a first insulative housing defining a receiving room and a plurality of first contacts received in the receiving room, and the second connector comprises a second insulative housing and a plurality of second contacts mounted to the second insulative housing, the second insulative housing comprising a base portion and a mating portion inserted into the receiving room to electrically connect the second contacts with the first contacts.

7. An optical-electrical connector comprising:

a thermal conductive shell;

a printed circuit board assembly received in the thermal conductive shell, the printed circuit board assembly comprising a printed circuit board comprising a thermal conductive layer thermal conductively connected with the thermal conductive shell;

an optical-electrical module mounted on the printed circuit board and being in contact with the thermal conductive layer, heat produced by the optical-electrical module being transferred to the thermal conductive shell by the thermal conductive layer; and an electromagnetic interference gasket surrounding the thermal conductive shell, the electromagnetic interference gasket comprising a pair of mounting walls inserted into the thermal conductive shell, each of the mounting walls having at least one half ball shaped protruding latched with the thermal conductive shell.

\* \* \* \* \*